United States Patent
Kim et al.

(10) Patent No.: US 6,809,006 B2
(45) Date of Patent: Oct. 26, 2004

(54) METHOD OF SEMICONDUCTOR DEVICE ISOLATION

(75) Inventors: Bong Soo Kim, Seoul (KR); Jeong Bok Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/242,219

(22) Filed: Sep. 12, 2002

(65) Prior Publication Data

US 2003/0049911 A1 Mar. 13, 2003

(30) Foreign Application Priority Data

Sep. 13, 2001 (KR) .......................................... 2001-56513

(51) Int. Cl.$^7$ ............................................... H01L 21/76
(52) U.S. Cl. ....................................... 438/433; 438/524
(58) Field of Search ........................ 438/524, 425–433, 438/439, 424, 450, 434

(56) References Cited

U.S. PATENT DOCUMENTS

| | | | |
|---|---|---|---|
| 5,879,986 A | | 3/1999 | Sung |
| 5,970,352 A | | 10/1999 | Shiozawa et al. |
| 5,981,326 A | | 11/1999 | Wanlass |
| 6,030,882 A | * | 2/2000 | Hong .......................... 438/433 |
| 6,054,344 A | | 4/2000 | Liang et al. |
| 6,069,047 A | | 5/2000 | Wanlass |
| 6,090,672 A | | 7/2000 | Wanlass |
| 6,096,618 A | | 8/2000 | Dunn et al. |
| 6,103,592 A | | 8/2000 | Levy et al. |
| 6,194,285 B1 | | 2/2001 | Lin et al. |
| 6,214,670 B1 | | 4/2001 | Shih et al. |
| 6,255,152 B1 | | 7/2001 | Chen |
| 2001/0055861 A1 | * | 12/2001 | Patti et al. ................... 438/524 |
| 2002/0155708 A1 | * | 10/2002 | Lo et al. ...................... 438/689 |

* cited by examiner

*Primary Examiner*—Dung A. Le
(74) *Attorney, Agent, or Firm*—Ladas & Parry LLP

(57) ABSTRACT a method of semiconductor device isolation, which can minimize an design rule of trenches comprising the steps of providing a substrate where a device isolation region was defined; removing the device isolation region of the substrate using a photolithography process to form trenches; implanting ions into the substrate having the trenches to form an impurity layer having a uniform depth relative to the surface of the substrate; thermally oxidizing the substrate having the impurity layer to form an oxide film; and removing the oxide film.

11 Claims, 7 Drawing Sheets

METHOD OF SEMICONDUCTOR DEVICE ISOLATION

BACKGROUND OF THE INVENTION

1. Field of the Invention

The present invention relates generally to a method of semiconductor device isolation, and more particularly to a method of semiconductor device isolation, which can minimize design rule of an active region between trenches formed at an isolation region of a semiconductor device.

2. Description of the Prior Art

Semiconductor devices formed on a silicon wafer include a device isolation region serving to electrically isolate circuit patterns from each other. The formation of the device isolation region is an initial process in all fabrication processes, and has an influence upon the size of active regions and upon the process margin in subsequent processes. Thus, as semiconductor devices become more highly integrated and sized down, actively conducted studies to reduce a size of the respective devices and also to reduce the device isolation region are being conducted.

Generally, the LOCOS method, widely used in fabrication of semiconductor devices, is advantageous in that it utilizes a simple process. In a highly integrated semiconductor device of the 256 Megabit DRAM level or above, however, the LOCOS method has limitations due to punch-through by the bird's beak that results from a reduction in width of the device isolation region, as well as a reduction in the thickness of the device isolation film.

For this reason, a device isolation method using trenches, such as the Shallow Trench Isolation (STI) process, were proposed as a technology suitable for device isolation in highly integrated semiconductor devices.

FIGS. 1A to 1D illustrate in cross-sectional views the method steps showing a method of semiconductor device isolation according to the prior art.

As shown in FIG. 1A, the method of semiconductor device isolation includes applying a photoresist film on a semiconductor substrate 100 where a device isolation region (not shown) was previously defined. The photoresist film is then exposed to light and developed, thereby forming a photoresist pattern (PR) 102 through which the device isolation region is exposed.

In FIG. 1A, a1 represents the minimum design rule of active region between trenches 104 that is capable of being defined using the existing photo equipment, and has a dimension far greater than 0.1 μm.

Thereafter, the substrate 100 is etched according to the STI process using the photoresist pattern (PR) 102 as a mask, thereby forming trenches 104.

Then, the photoresist pattern is removed. As shown in FIG. 1B, the entire surface of the substrate 100 where the trenches 104 were formed is subjected to a thermal oxidation process to form a first oxide film 106 on the surface of the substrate and along the inner wall of the trenches 104. The formation of the first oxide film 106 is carried out for recovery of any substrate silicon components that may have been damaged by the STI dry etching process during formation of the trenches 104.

Thereafter, the first oxide film is removed, as shown in FIG. 1C. The reference numeral 110 denotes the final shape of the trenches resulting after removal of the first oxide film, in distinction from the reference numeral 104.

Subsequently, as shown in FIG. 1D, a second oxide film 112 is formed by depositing an insulating film, such as a silicon oxide film or the like, on the resulting substrate, using a Chemical Vapor Deposition (CVD) process. The second oxide film is etched using a Chemical Mechanical Polishing (CMP) process or etch back process, so that a device isolation film is formed which is filled in the respective final trenches 110 with the second oxide film 112.

FIG. 2 is a cross-sectional view showing drawbacks occurring by utilizing the method of the prior art shown above. In the method according to the prior art, shown in FIGS. 1A–1D, as the STI dry etching process for formation of the trenches is carried out, defects are caused at portions of the silicon substrate where the trenches were formed. If the substrate is subjected to a thermal oxidation process in a state where the defects are not removed, the oxidation rate at the bottom portion of the trenches is then significantly different from the oxidation rate at the sidewall portion thereof. In other words, the sidewall portion of the trench is far higher than the bottom portion in oxidation rate. For this reason, the linewidth between device isolation films will have a dimension far greater than 0.1 μm.

In addition, if the substrate including the trenches having the different oxidation rate is subjected to an ion implantation process, there is a problem in that the trenches act as a trap site of impurities.

SUMMARY OF THE INVENTION

Accordingly, the present invention has been made to solve the above-mentioned problems occurring in the prior art, and an object of the present invention is to provide a method of semiconductor device isolation, which can finely define the design rule of active region between trenches to have a dimension less than 0.1 μm by maintaining the oxidation rate of the bottom portion of the trenches at the same level as that of the sidewall portion thereof.

To accomplish this object, there is provided a method of semiconductor device isolation, which comprises the steps of providing a substrate where a device isolation region was defined; removing the device isolation region of the substrate using a photolithography process to form trenches; implanting ions into the substrate having the trenches to form an impurity layer having a uniform depth relative to the surface of the substrate; oxidizing the substrate having the impurity layer to form an oxide film; and removing the oxide film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail with reference to the accompanying drawing FIGS. 3A–5C.

FIGS. 3A to 3E are cross-sectional views showing the method steps of a process for semiconductor device isolation according to the present invention.

Figure 3A:
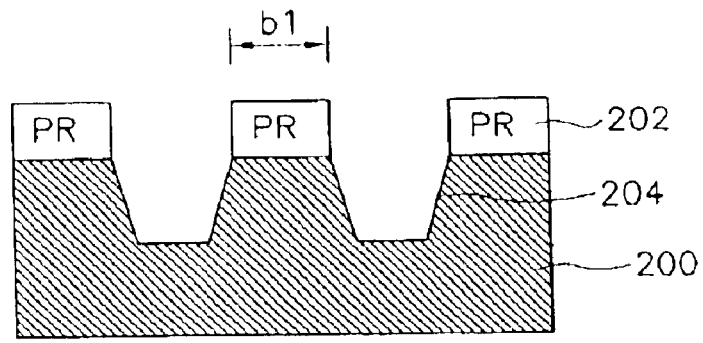
FIGS. 3A to 3E are cross-sectional views showing the method steps of a process for semiconductor device isolation according to the present invention.

As shown in FIG. 3A, the method steps of semiconductor device isolation according to the present invention include applying a photoresist film on a semiconductor substrate 200 where a device isolation region (not shown) was defined. The photoresist film is then exposed to light and developed, thereby forming a photoresist pattern (PR) 202 through which the device isolation region is exposed.

In FIG. 3A, b1 represents a minimum design rule of trenches capable of defining using the existing photo equipment, and has a dimension far greater than 0.1 μm.

Thereafter, the substrate 200 is etched using the photoresist pattern (PR) 202 as an etching mask, to thereby form trenches 204.

Figure 3B:
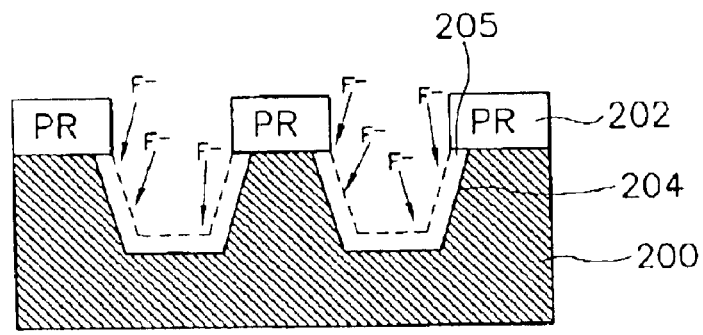

Next, as shown in FIG. 3B, F ions are implanted into the substrate 200 using the photoresist pattern (PR) 202 as an impurity-blocking mask, to thereby form an impurity layer 205. At this time, the F ion implantation process is carried out by implanting the F-containing ions at a dose of more than 10$^{14}$ (atom/cm$^2$) in batch-type ion implantation equipment or a single wafer chamber. In the single wafer chamber, rotation is repeated four times.

Where the F ion implantation process is carried out in the batch-type ion implantation equipment, the F-containing ions are implanted at an angle of one degree or more.

Also, when the ion implantation process is carried out in the single wafer chamber, wet oxidation or dry oxidation process is carried out at 900° C. or above. At this time, the dry oxidation is carried out by supplying 5 slm (Standard Liter per Minute) of O$_2$ gas for more than 10 minutes under atmospheric pressure, and the wet oxidation is carried out under O$_2$ and H$_2$ atmospheres.

Thus, using the ion implantation process, the impurity layer 205 is distributed to a uniform depth from the bottom surface and sidewall of the trenches 204, as shown by the phantom lines.

Figure 3C:
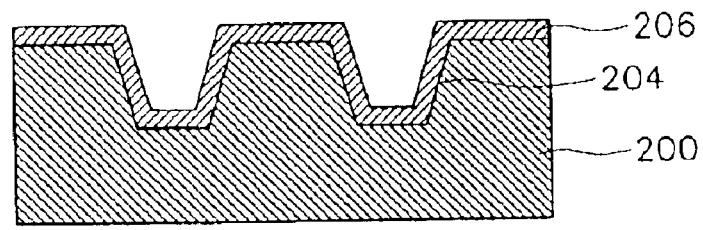

Next, the photoresist pattern is removed by using a wet oxidation or dry oxidation process. As shown in FIG. 3C, the entire surface of the substrate including the impurity layer 205 is subjected to the wet oxidation or dry oxidation process, thereby forming a first oxide film 206.

In other words, the surface of the substrate and the impurity layer are reacted with atmospheric oxygen by the thermal oxidation process, so that the first oxide film 206 is formed at the surface of the substrate 200 and the sidewall portion of the trenches 204 to have the same thickness.

Figure 4:
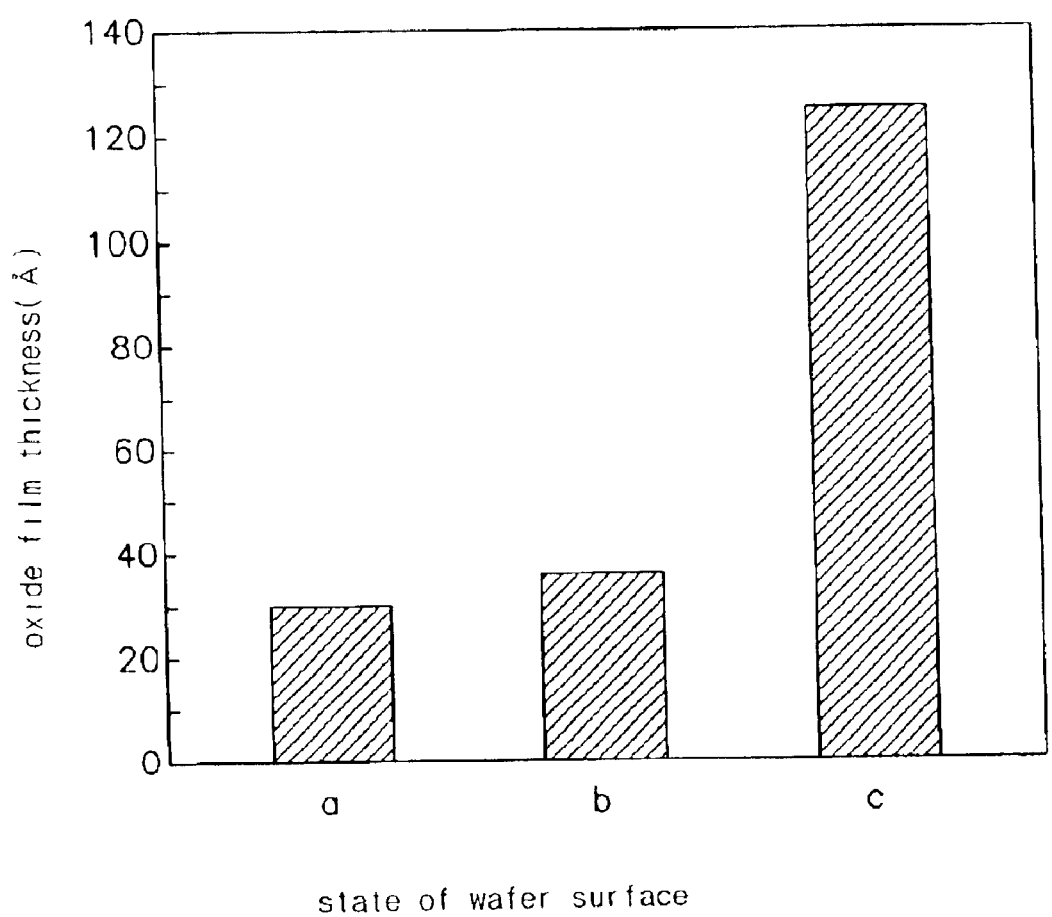
FIG. 4 is a graphical representation showing the thicknesses of an oxide film applied according to the invention where F ions were implanted, a bare state where no ions were implanted, and a state where As ions were implanted.

FIG. 4 graphically shows the thickness of the oxide film according to various conditions or states. In FIG. 4, the graph designated a shows a thickness of an oxide film according to the bare state where no ions were implanted; the graph designated b shows a thickness of the oxide film according to a state where the oxide film was subjected to a thermal treatment in a chamber at 700° C. under an oxygen atmosphere for one minute and then at 1050° C. under a nitrogen atmosphere for 10 seconds; and the graph designated shows the thickness of an oxide film according to the c inventive state where the F ions were implanted.

Figure 5A:
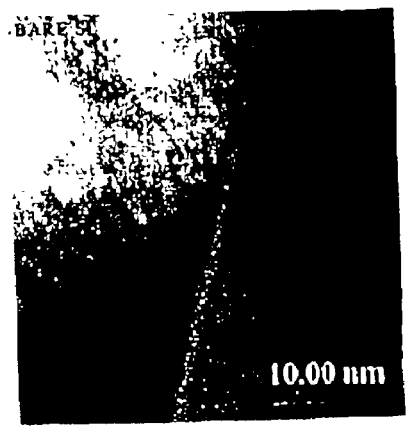
FIG. 5A is a TEM photograph for a bare substrate.
Figure 5B:
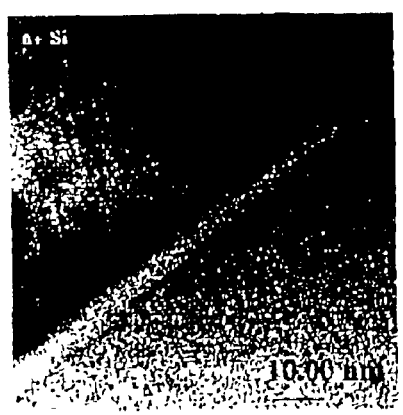
FIG. 5B a TEM photograph for a substrate into which As ions were implanted at a dose of $3\times10^{15}$ (atom/cm$^2$)

In addition, FIG. 5A is a TEM photograph depicting a bare substrate; FIG. 5B is a TEM photograph depicting a substrate into which As ions were implanted at a dose of 3×10$^{15}$ (atom/cm$^2$); and FIG. 5C is a TEM photograph depicting a substrate into which F ions were implanted at a dose of 5×10$^{15}$ (atom/cm$^2$).

FIG. 5A shows a bare substrate into which no ions were implanted. This substrate was thermally treated by a supply of oxygen gas at a flow rate of 5 slm for one minute at 700° C., and rapidly thermally treated by a supply of nitrogen gas for 10 seconds at a temperature of 900° C. to 1,100° C., and preferably at 1,050° C.

FIG. 5B shows a substrate into which as ions were implanted at a dose of 3×10$^{15}$ (atom/cm$^2$). This substrate was thermally treated by a supply of oxygen gas at a flow rate of 5 slm for one minute at 700° C., and then rapidly thermally treated by a supply of nitrogen gas for 10 seconds at a temperature of 900° C. to 1,100° C., and preferably at 1,050° C.

Figure 5C:
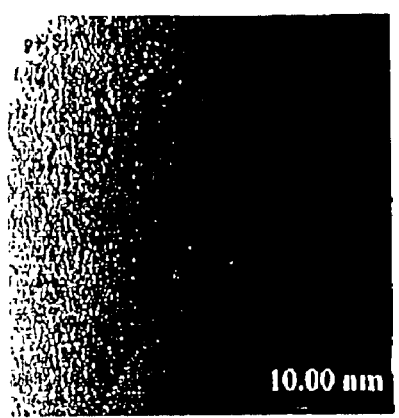
FIG. 5C a TEM photograph for a substrate into which F ions were implanted at a dose of 5×10$^{15}$ (atom/cm$^2$).

FIG. 5C shows a substrate into which F ions were implanted at a dose of 5×10$^{15}$ (atom/cm$^2$). This substrate, where the trenches had been formed, was thermally treated by a supply of oxygen gas at a flow rate of 5 slm for one minute at 700° C., and rapidly thermally treated by a supply of nitrogen gas for 10 seconds at a temperature of 900° C. to 1,100° C., and preferably at 1,050° C.

As shown in FIG. 4 and FIGS. 5A to 5C, it is evident that, where F ions are implanted at a dose of 5×10$^{15}$ (atom/cm$^2$) according to the present invention (graph c), oxidation occurs much better than that of other cases (graphs a and b). It has also been found that uniformity of the oxide film is excellent.

In other words, the first oxide film 206 formed according to present invention exhibits a degree of oxidation far higher than that of the other films into which either as ions were implanted or no ions were implanted. Also, the first oxide film 206 has an excellent uniformity.

Figure 3D:
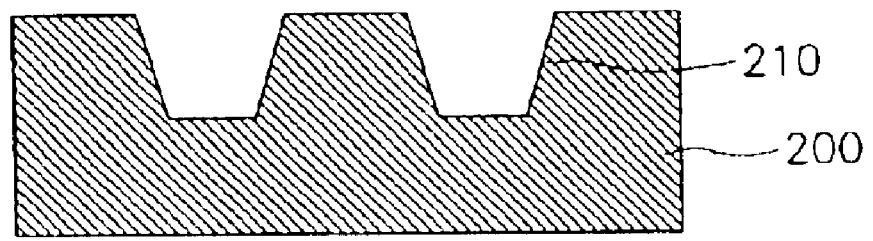

Thus referring again to the method steps of fabrication, and as shown in FIG. 3D, the first oxide film is removed to form final uniform trenches 210.

Figure 3E:
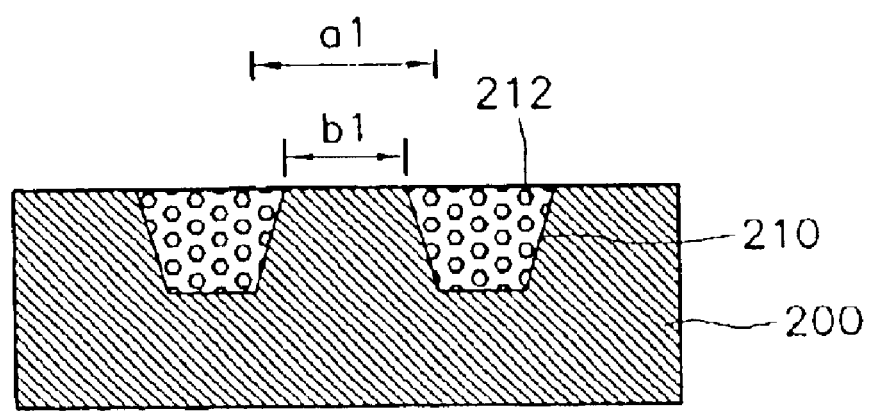

Next, as shown in FIG. 3E, a second oxide film 212 is deposited all over the surface of the resulting substrate, and then wet-etched using the CMP or etch back process, so that a device isolation film is formed which is filled in the respective trenches 210. The wet etch process may be carried out using a HF or buffer oxide etchant (BOE) solution.

Figure 1A:
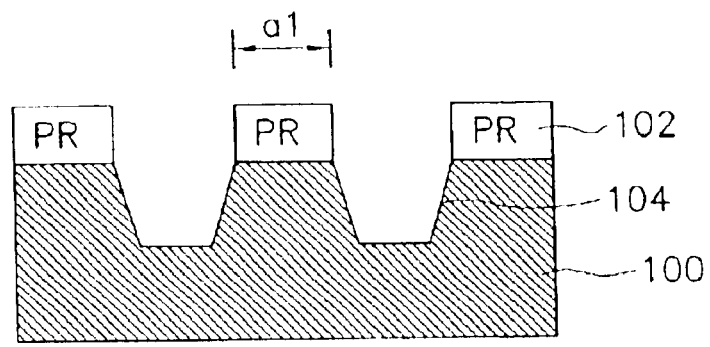
FIGS. 1A to 1D are cross-sectional views showing the method steps of a process for semiconductor device isolation according to the prior art.
Figure 1B:
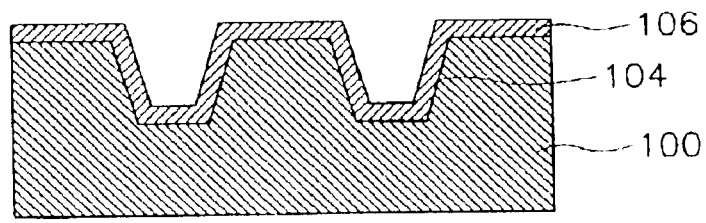
Figure 1C:
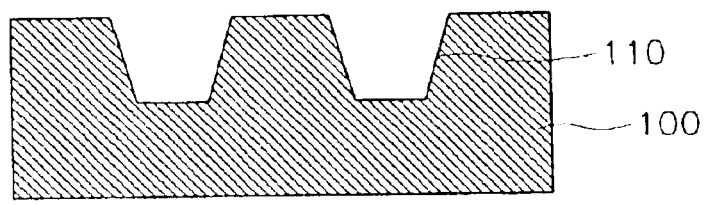
Figure 1D:
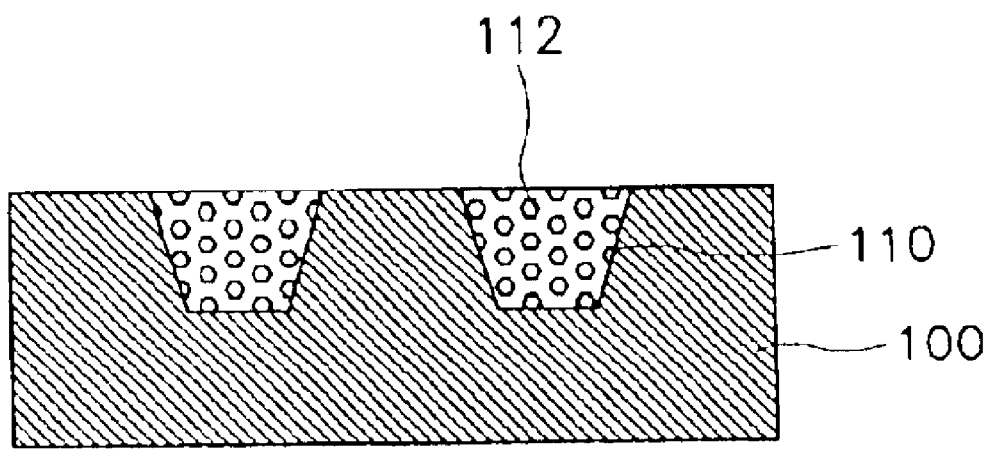
Figure 2:
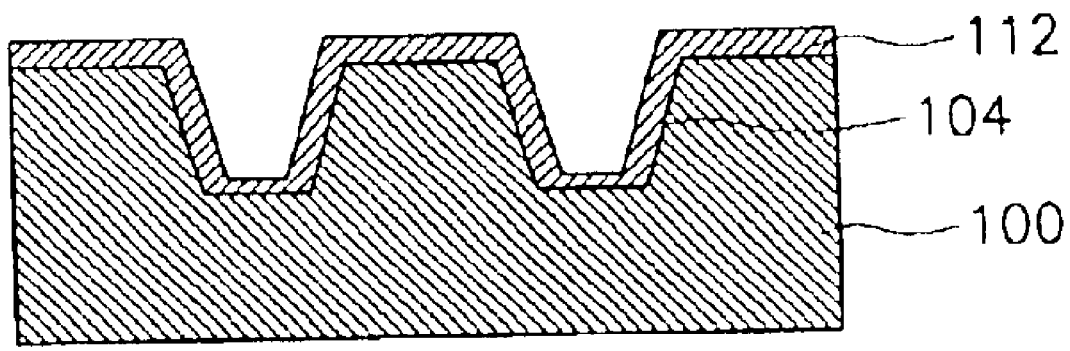
FIG. 2 is a cross-sectional view of the substrate isolation showing problems with the trench of the prior art.

Thus, as shown in FIG. 3E, the design rule b1 of the active region between trenches formed according to the present invention is narrower than the design rule of the active region between trenches formed according to the prior art (FIG. 1A).

As is apparent from the foregoing, the steps of the method of semiconductor device isolation according to the present invention include forming the impurity layer having a uniform depth from the surface of the substrate by a supply of the F ion-containing gas into the trenches, and oxidizing and removing the impurity layer. Accordingly, the method of the present invention can correct the silicon substrate for defects caused during the dry etching process used for formation of the trenches, and thus will improve the characteristics of the semiconductor device.

In addition, the method of the present invention overcomes limitations of the existing photo equipment by forming the first oxide film at the bottom and sidewall portion of the trenches to the same thickness. Thus, according to the method of the present invention, trenches having fine interval spacing, and device isolation films filled in the respective trenches, can be obtained.

Although a preferred embodiment of the present invention has been described for illustrative purposes, those skilled in the art will appreciate that various modifications, additions, alterations and substitutions are possible, without departing from the scope and spirit of the invention as limited by the accompanying claims.

What is claimed is:

1. A method of forming semiconductor device isolation, which comprises the steps of:
   providing a substrate, in which a device isolation region has been defined;
   removing the device isolation region of the substrate using a photolithography process to form trenches;
   implanting ions into the substrate having the trenches to form an impurity layer having a uniform depth relative to the surface of the substrate;
   thermally oxidizing the substrate having the impurity layer to form an oxide film, wherein the thermal oxidation step is carried out using dry oxidation under atmospheric pressure by supplying $O_2$ gas of 5 slm for more than 10 seconds in a chamber under atmospheric pressure and more than 900° C.; and
   removing the oxide film.

2. The method of claim 1, wherein the oxide film is removed by wet etching.

3. The method of claim 2, wherein the oxide film is removed using a HF or BOE solution.

4. The method of claim 1, further comprising the step of forming a device isolation film filled in the respective trenches, after the step of removing the oxide film.

5. The method of claim 1, wherein the impurity layer is formed by implanting ions from a supply of a F ion-containing gas.

6. The method of claim 1, wherein the ion implantation step is carried out by implanting the ions at an angle of more than 1 degree, in batch-type ion implantation equipment.

7. The method of claim 1, wherein the ion implantation step is carried out by repeating rotation four times in a single wafer chamber.

8. The method of claim 1, wherein the oxide film-forming step is carried out in a chamber at more than 900° C. under atmospheric pressure using wet or dry oxidation.

9. A method of forming semiconductor device isolation, comprising the steps of:
   providing a substrate, in which a device isolation region has been defined;
   removing the device isolation region of the substrate using a photolithography process to form trenches;
   implanting ions into the substrate having the trenches to form an impurity layer having a uniform depth relative to the surface of the substrate;
   thermally oxidizing the substrate having the impurity layer to form an oxide film, wherein the thermal oxidation step is carried out in a chamber using wet oxidation under $O_2$ and $H_2$ atmospheres at atmospheric pressure and at more than 900° C.; and
   removing the oxide film.

10. The method of claim 9, wherein the trenches are formed by a dry etching process.

11. The method of claim 10, wherein the F ion-containing gas is supplied at a dose of at least $10^{14}$ (atom/cm$^2$).

* * * * *